United States Patent
Narendrnath et al.

(10) Patent No.: US 6,913,670 B2
(45) Date of Patent: Jul. 5, 2005

(54) SUBSTRATE SUPPORT HAVING BARRIER CAPABLE OF DETECTING FLUID LEAKAGE

(75) Inventors: Kadthala R. Narendrnath, San Jose, CA (US); Michael Douglas, Sunnyvale, CA (US); Surinder Bedi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 159 days.

(21) Appl. No.: 10/118,758

(22) Filed: Apr. 8, 2002

(65) Prior Publication Data

US 2003/0188830 A1 Oct. 9, 2003

(51) Int. Cl.[7] .......................... H01L 21/00; C23C 16/00
(52) U.S. Cl. .................... 156/345.24; 156/345.51; 156/345.53; 118/724; 118/728; 204/192.1; 204/298.1
(58) Field of Search ................. 156/345.24, 345.51, 156/345.53; 118/715–730; 204/192.1, 298.1, 192.2, 298.2

(56) References Cited

U.S. PATENT DOCUMENTS

| | | |
|---|---|---|
| 4,297,686 A | 10/1981 | Tom |
| 4,376,514 A | 3/1983 | Coffee |
| 4,391,846 A | 7/1983 | Raymond |
| 4,737,474 A | 4/1988 | Price et al. |
| 4,922,232 A | 5/1990 | Bosich |
| 4,966,869 A | 10/1990 | Hillman et al. |
| 5,138,643 A * | 8/1992 | Sakamoto et al. ............ 378/34 |
| 5,202,667 A | 4/1993 | Alvin |
| 5,583,737 A | 12/1996 | Collins et al. |
| 5,636,098 A | 6/1997 | Salfelder et al. |
| 5,812,361 A | 9/1998 | Jones et al. |
| 6,112,579 A | 9/2000 | Tryba |
| 6,165,234 A | 12/2000 | Kanakkanatt |
| 6,228,804 B1 * | 5/2001 | Nakashima ................. 503/226 |
| 6,303,046 B1 * | 10/2001 | Risen et al. .................... 252/1 |
| 6,406,545 B2 * | 6/2002 | Shoda et al. ................. 118/724 |

FOREIGN PATENT DOCUMENTS

| | | |
|---|---|---|
| JP | 10176971 | 6/1998 |
| WO | 001002 A1 | 1/2000 |

* cited by examiner

*Primary Examiner*—P. Hassanzadeh
*Assistant Examiner*—Ram N Kackar
(74) *Attorney, Agent, or Firm*—Janah & Associates (57) ABSTRACT

A substrate support has a receiving surface capable of receiving a substrate during processing in a substrate processing chamber. The substrate support has a pedestal having a conduit to circulate a heat transfer fluid therein. A barrier about the conduit includes a fluid detection material capable of detecting a leakage of the fluid from the conduit be changing an attribute, for example, an optical or electrical property.

15 Claims, 6 Drawing Sheets

SUBSTRATE SUPPORT HAVING BARRIER CAPABLE OF DETECTING FLUID LEAKAGE

BACKGROUND

This invention relates to a substrate support for supporting substrates during processing.

In the fabrication of electronic circuitry, semiconductor, dielectric and conductor materials, such as for example, polysilicon, silicon dioxide, and metal containing materials, are formed on a substrate, and etched to form features such as gates, vias, contact holes and interconnect lines. The materials are typically formed by chemical vapor deposition (CVD), physical vapor deposition (PVD), oxidation and nitridation processes performed on the substrate. Thereafter, in typical etching processes, a patterned mask of photoresist or oxide hard mask is formed on a deposited material by photolithography and exposed portions of the substrate material are etched by an energized gas.

During the forming and etching of materials on the substrate, the substrate may be supported in the chamber by a temperature controlled substrate support. The temperature of the support is often controlled by circulating a fluid in conduits in the support. However, sometimes, the fluid leaks out from the conduits during processing of the substrate. Such fluid leakage changes the temperature of the substrate resulting in improper processing of the substrates. Fluid leakage can also cause the gas pressure and composition in the chamber to change by vaporizing and mixing with the gas. Leakage of fluid also leads to undesirable chamber downtime to repair or replace portions of the chamber corroded by the leaking fluid.

Thus, there is a need to inhibit the leakage of the fluid passed through the support. There is also a need to quickly detect any leakage of the fluid to alert the chamber operator so that processing of the substrates can be halted.

SUMMARY

A substrate support comprising:
- a pedestal comprising a substrate receiving surface to receive the substrate;
- a conduit in the pedestal to circulate a fluid to the pedestal; and
- a barrier about the conduit, the barrier comprising a material capable of changing attributes upon exposure to fluid leaking out from the conduit.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

FIG. 1b is a schematic view of the barrier and second section of the support of FIG. 1a;

DESCRIPTION

Figure 1A:
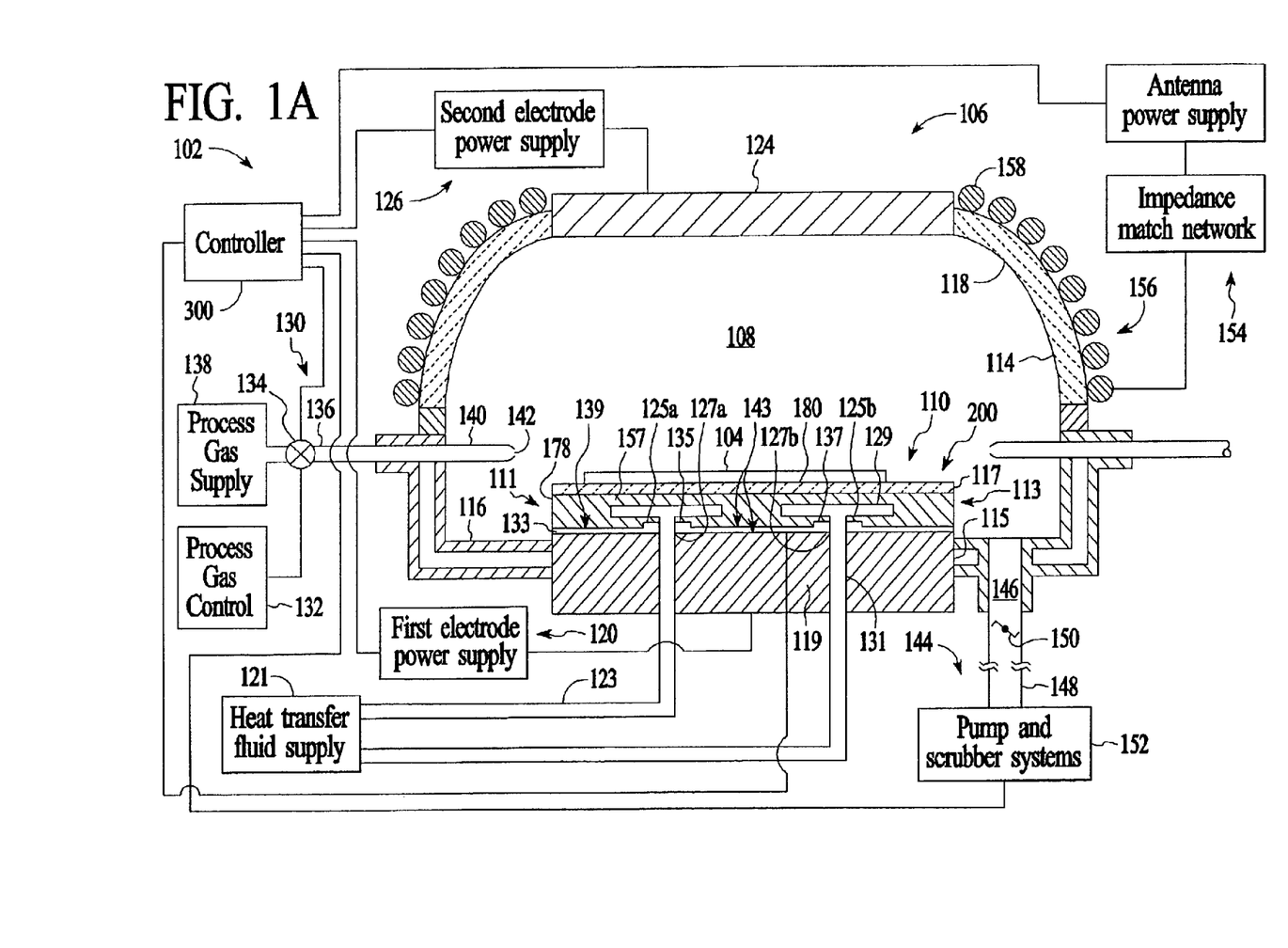
FIG. 1a is a schematic sectional side view of a version of a process chamber having a substrate support having a barrier according to the present invention.

An exemplary version of an apparatus 102 suitable for processing a substrate 104 according to the present invention is shown in FIG. 1a. The apparatus comprises a process chamber 106 defining a process zone 108 for processing of the substrate 104. The substrate 104 is typically held in the process zone 108 on a support 110, which may include an electrostatic chuck (not shown) which is chargeable to electrostatically hold the substrate 104. The chamber 106 has sidewalls 114, a bottom wall 116, and a ceiling 118 facing the substrate 104. The top portion 124 of the ceiling 118 may act as an anode which may be electrically biased by a second electrode power supply 126. The chamber 106 may be fabricated from any of a variety of materials including metals, ceramics, glasses, polymers and composite materials. For example, metals commonly used to fabricate the chamber 106 include aluminum, anodized aluminum, "HAYNES 242," "Al-6061," "SS 304," "SS 316," and INCONEL, of which anodized aluminum is used to fabricated a preferred version. The ceiling 118 comprises a flat, rectangular, arcuate, conical, dome or multiradius-arcuate shape as shown in FIG. 1a. The particular embodiment of the apparatus 102 shown herein is suitable for processing of active and passive electronic devices on a substrate 104, and is provided only to illustrate the invention, and should not be used to limit the scope of the invention.

In one version, the process chamber 106 may be used as a deposition chamber to deposit material on a substrate 104, for example, to deposit a silicon-containing material, such as polysilicon, silicon nitride, silicon oxide or metal silicide; to deposit a metal-containing material, such as aluminum or copper; or to deposit any other material on the substrate 104. Process gas comprising, for example, deposition gas, is introduced into the chamber 106 by a gas supply 130 comprising a gas flow control 132 that operates one or more gas flow meters 134 on a gas feed conduit 136 that can transport a gas, such as a process gas, from a gas source 138 to a gas distributor 140 in the chamber 106. The gas distributor 140 comprises gas outlets 142 which may be located peripherally around the substrate 104 (as shown in FIG. 1) or near the ceiling 118 of the chamber 106 (not shown). The process gas introduced in the chamber 106 is exhausted by an exhaust system 144 that includes an exhaust conduit 146, an exhaust line 148, a throttle valve 150, and pumps and scrubber systems 152 which may include roughing and turbo-molecular pumps. The exhaust conduit 146 is a port or channel that receives the gas provided in the chamber 106 for exhausting the gas, and that is typically positioned around the periphery of the substrate 104. The exhaust line 148 connects the exhaust conduit 146 to the pump and scrubber systems 152, and the throttle valve 150 in the exhaust line 148 may be used to control the pressure of the gas in the chamber 106.

A plasma is formed from the process gas introduced into the chamber 106 by a plasma generator 154 that couples electromagnetic energy into the process zone 108 of the chamber 106. A suitable plasma generator 154 comprises an inductor antenna 156 comprising one or more inductor coils 158 covering the ceiling 118 of the chamber 106. In one version, the coils may have a circular symmetry about a central axis of the chamber 106, the arrangement and number of the coils being selected to provide the desired product of current and antenna turns (d/dt)(N·I) near the ceiling 118 to provide a good inductive flux into the plasma. In this version, the ceiling 118 may be made of a dielectric material that is permeable to electromagnetic energy, such as RF energy, for example, silicon or silicon dioxide.

Figure 2:
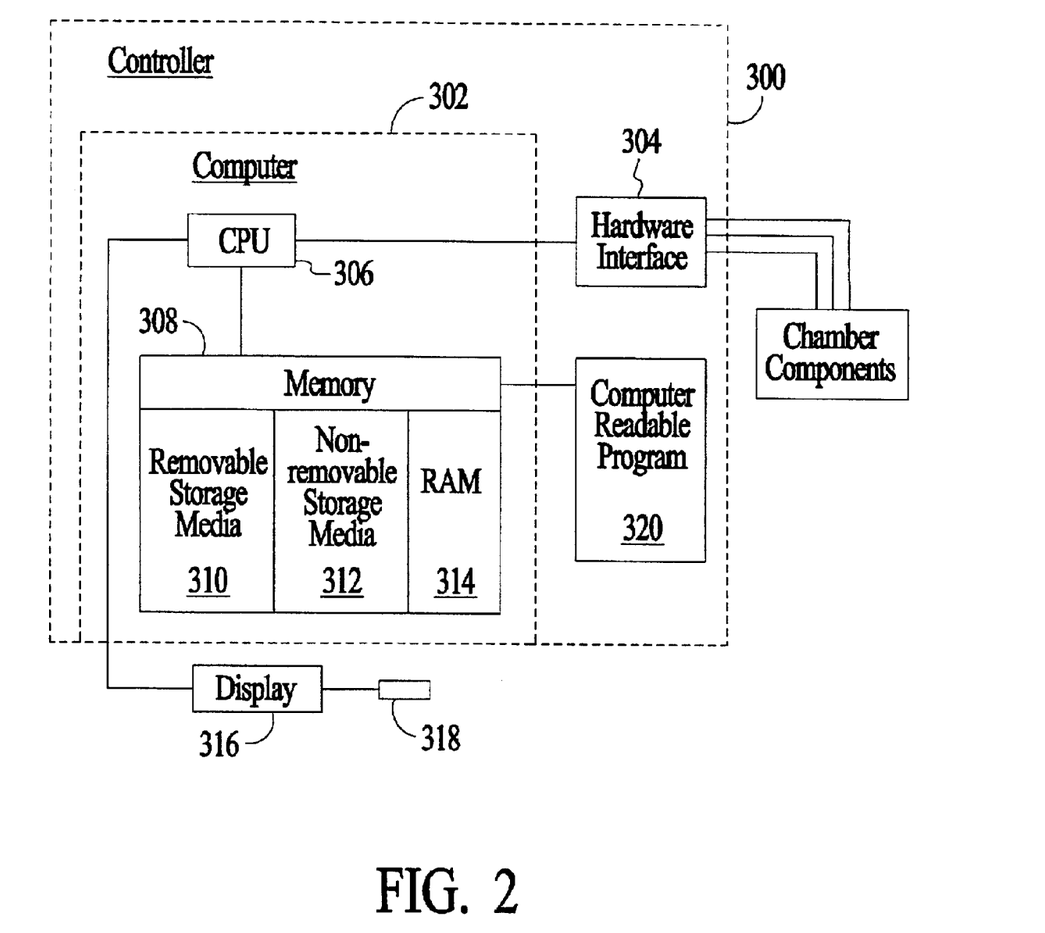
FIG. 2 is an illustrative block diagram of a controller comprising a computer readable program according to the present invention.

The chamber 106 may be operated by a controller 300 via a hardware interface 304. The controller 300 may comprise a computer 302 which may comprise a central processor unit (CPU) 306, such as for example a 68040 microprocessor, commercially available from Synergy Microsystems, California, or a Pentium Processor commercially available from Intel Corporation, Santa Clara, Calif., that is coupled to a memory 308 and peripheral computer components, as shown in FIG. 2. Preferably, the memory 308 may include a removable storage media 310, such as for example a CD or floppy drive, a non-removable storage media 312, such as for example a hard drive, and random access memory 314. The controller 300 may further comprise a plurality of interface cards including, for example, analog and digital input and output boards, interface boards, and motor controller boards. The interface between an operator and the controller 300 can be, for example, via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

In one version the controller 300 comprises a computer-readable program 320 that may be stored in the memory 308, for example on the non-removable storage media 312 or on the removable storage media 310. The computer readable program 320 generally comprises process control software comprising program code to operate the chamber 106 and its components, process monitoring software to monitor the processes being performed in the chamber 106, safety systems software, and other control software. The computer-readable program 320 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program.

In operation, a substrate 104 is provided on the support 110 in the chamber 106. Process gas, such as a deposition gas, may be introduced into the chamber 106 via the gas distributor 140 and from around a periphery of the substrate 104 to process the substrate. A plasma may be formed from the process gas by energizing the plasma generator 154 to deposit a material on the substrate 104. For example, an insulator or dielectric material, such as for example, $SiO_2$ or $Si_3N_4$, may be deposited by chemical vapor deposition (CVD) using a process gas comprising one or more of $SiH_4$, $SiClH_2$, $CO_2$, $H_2$, $N_2O$, $Si(OC_2H_5)_4$, $NH_3$ and $N_2$.

Alternatively, a metal-containing material which may comprise an elemental metal, metal compound or a metal alloy, may also be deposited in the deposition chamber. For example, a tungsten-containing material may be deposited using a process gas comprising one or more of $WF_6$, $H_2$ and $SiH_4$; a molybdenum-containing material may be formed using, for example, process gas comprising $MoCl_5$ and $H_2$; and an aluminum-containing material may be formed using, for example, $AlCl_3$ or $Al(CH_3)_3$ mixed with Ar or $H_2$ or both. Thereafter, the substrate 104 is removed and another substrate 104 may be provided in the chamber 106 for processing. Instead of depositing material on the substrate 104, the chamber 106 may also be adapted to etch material on the substrate 104 in a typical etching process The substrate support 110 on which the substrate 104 is placed for processing comprises a pedestal 111 having a first section 113 and a second section 115. The first section 113 comprises an electrostatic chuck 200 comprising an electrode 178, covered by a dielectric layer 117, such as a ceramic layer, the upper surface of which forms a substrate receiving surface 180. The electrode 178 may be electrically charged by the first electrode power supply 120 to hold the substrate 104 on the substrate receiving surface 108 and is electrically isolated from the substrate 104 by the dielectric layer 117. The second section 115 is below the first section 113 to support the first section 113, and typically comprises a metal such as for example aluminum.

The pedestal 111 comprises one or more fluid conduits 119 in the first or second section 113, 115 through which a heat transfer fluid is circulated to control the temperature of the substrate 104. The heat transfer fluid is a fluid which is capable of transferring heat to or from the pedestal 111 and substrate 104. For example, the heat transfer fluid may transfer heat to or from the pedestal 111 to generally cool or heat the pedestal 111, to maintain the temperature of the pedestal 111 within a controlled range. The temperature controlled pedestal 111 in turn transfers heat to or from the substrate 104 through portions of the pedestal 111 which contact the substrate 104, such as for example the substrate receiving surface 180, to control the temperature of the substrate 104. Thus, the temperature of the substrate 104 may be controlled by circulating the heat transfer fluid in the fluid conduits 119 to provide a desired substrate temperature range.

The fluid conduits 119 may be arranged to form one or more fluid channels 129 and one or more supply tubes 131. The fluid channels 129 are shaped and sized to provide good heat transfer rates to or from the substrate 104. For example, the fluid channels 129 may form one or more concentric rings 157 that are adapted to circulate the heat transfer fluid in the sections 113, 115 of the pedestal 111. The concentric rings 157 may be centered about a central axis of the substrate 104 to provide symmetric heat transfer to and from the substrate 104. The supply tubes 131 extend through the support 110 to provide fluid to the fluid channels 129 from delivery tubes 123 that are connected to a heat transfer fluid supply 121.

The heat transfer fluid comprises fluid that is capable of providing good heat transfer rates between the fluid and the pedestal 111 to control the substrate temperature. In one version, the fluid may be a liquid, such as for example one or more of water, and ethylene glycol. A fluid comprising a liquid may make good contact with the portions of the pedestal 111 surrounding the conduits 119, thereby enabling efficient heat transfer. In another version, the fluid may be a gas, such as for example one or more of argon and helium. A fluid comprising a gas may make good contact with the pedestal 111 and may be suitable in, for example, higher temperature processes where some liquids may not be stable. Desirably, the heat transfer fluid is capable of heat transfer rates which are suitable to maintain the temperature of the substrate 104 within the desired range.

The temperature and flow rate of heat transfer fluid in the fluid conduits 119 may also be regulated to further control the rate of heat transfer between the pedestal 111 and the substrate 104. For example, the temperature of the fluid in the heat transfer fluid supply 121 may be regulated to control the temperature of the fluid supplied to the conduits 119. Flow control valves (not shown) may also be provided in the delivery tubes 123 to control the flow of fluid from the heat transfer fluid supply 121 to the fluid conduits.

In order to inhibit leakage of the heat transfer fluid from the conduits 119, the support 110 further comprises a barrier 139. The barrier 139 may comprise sealing surfaces 143 that are capable of inhibiting leakage from regions of the conduits 119 which are prone to leakage, such as for example inlets or outlets of the conduits 119. The sealing surfaces 143 comprise a sealing material that inhibits the leakage of the fluid by adhering to surfaces about the conduits 119 and forming a substantially impermeable barrier to the fluid. For example, the sealing surfaces 143 may comprise a sealing material comprising, for example, one or more of silicone, viton, neoprene, the material sold under the trademark "chemraz", and the material sold under the trademark "kelraz". The barrier 139 inhibits leakage of the heat transfer fluid from the conduits 119, thereby maintaining a good flow of the fluid to control the temperature of the substrate 104 and reduce contamination of the chamber 106 and substrate 104 from leaking fluid.

Figure 3A:
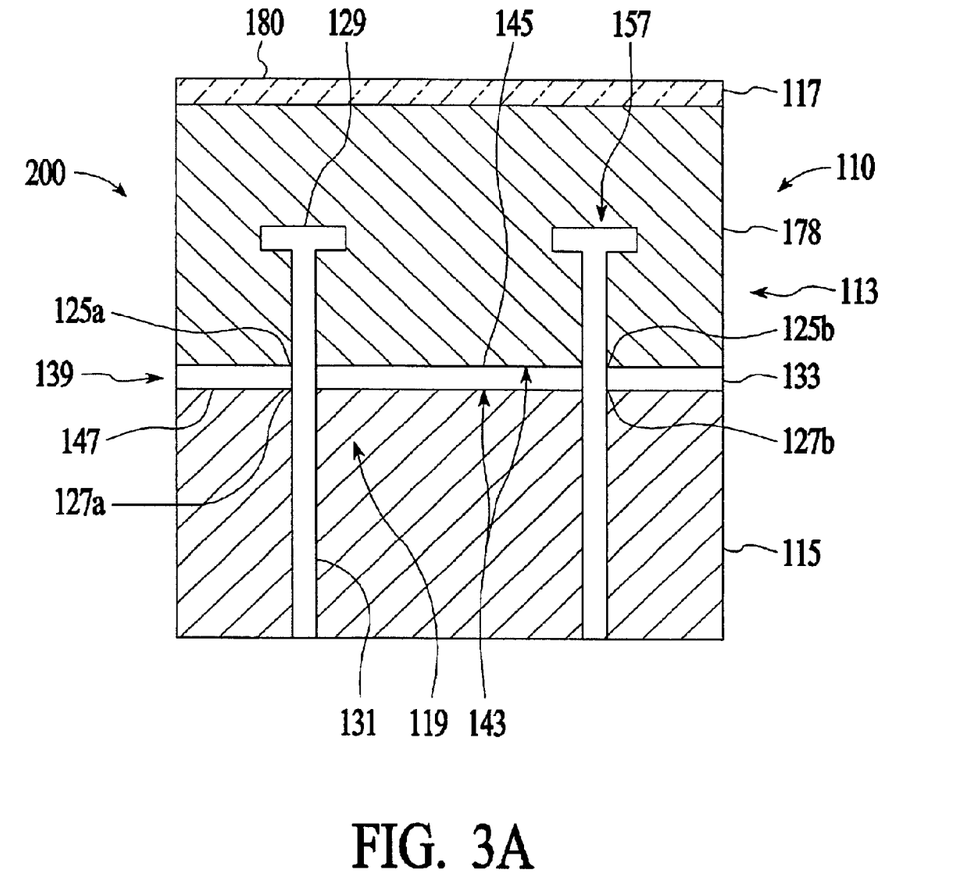
FIG. 3a is a schematic side view of a version of a support according to the present invention having a barrier.
Figure 3B:
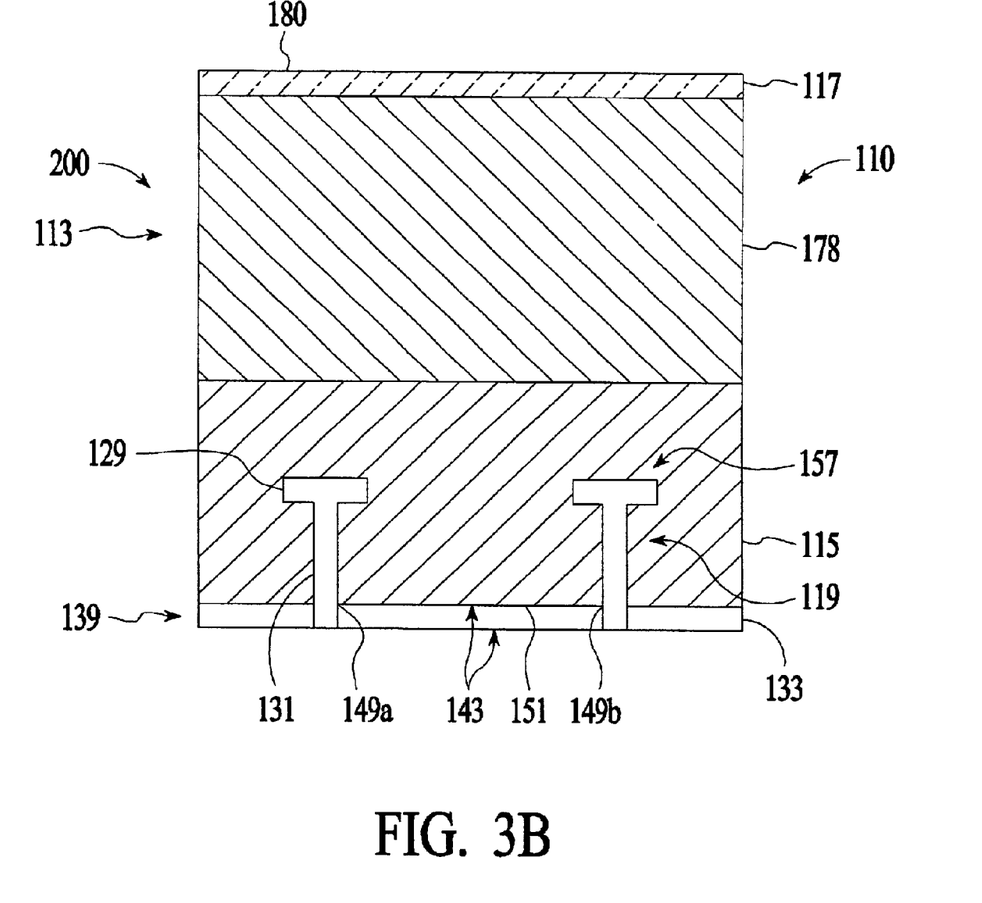
FIG. 3b is a schematic side view of another version of a substrate support according to the present invention having a barrier.

In one version, the barrier 139 comprises a disk 133 that surrounds portions of the conduits 119 which may be prone to leakage. FIG. 3a shows an example of such a barrier 139 comprising a disk 133 arranged between the first and second sections 113, 115 of the pedestal 111 to inhibit leakage of the heat transfer fluid as it flows between the outlet or inlet 127a,b of the second section 113 and the outlet or inlet 125a,b of the first section 113. Fluid flowing between the second section 115 and the first section 113 flows through the portion of the supply tube 131 formed in the disk 133, and is inhibited from leaking from the tube 131 by sealing surfaces 143 of the barrier 139 which form a seal with a bottom surface 145 of the first section 113 of the pedestal 111 and with a top surface 147 of the second section 115. Another example of a barrier 139 comprising a disk 133 is shown in FIG. 3b, wherein the disk 133 is arranged underneath the second section 115 of the pedestal 111 to inhibit leakage of the fluid as it flows between the fluid delivery tube 123 (shown in FIG. 1a) and the inlet or outlet 149a,b of the second section 115. The sealing surfaces 143 of the barrier 139 form a seal with a bottom surface 151 of the second section 115 of the pedestal 111 and with a surface underneath the second section 115, which may be a surface of the support 110 or a surface of the bottom wall 116 of the chamber 106, to inhibit the leakage of the fluid. The barrier 139 comprising the disk 133 inhibits leakage of the fluid from the conduits 119 about leak prone regions of the conduits 119, thereby maintaining a good flow of the fluid in the pedestal 111.

Figure 1B:
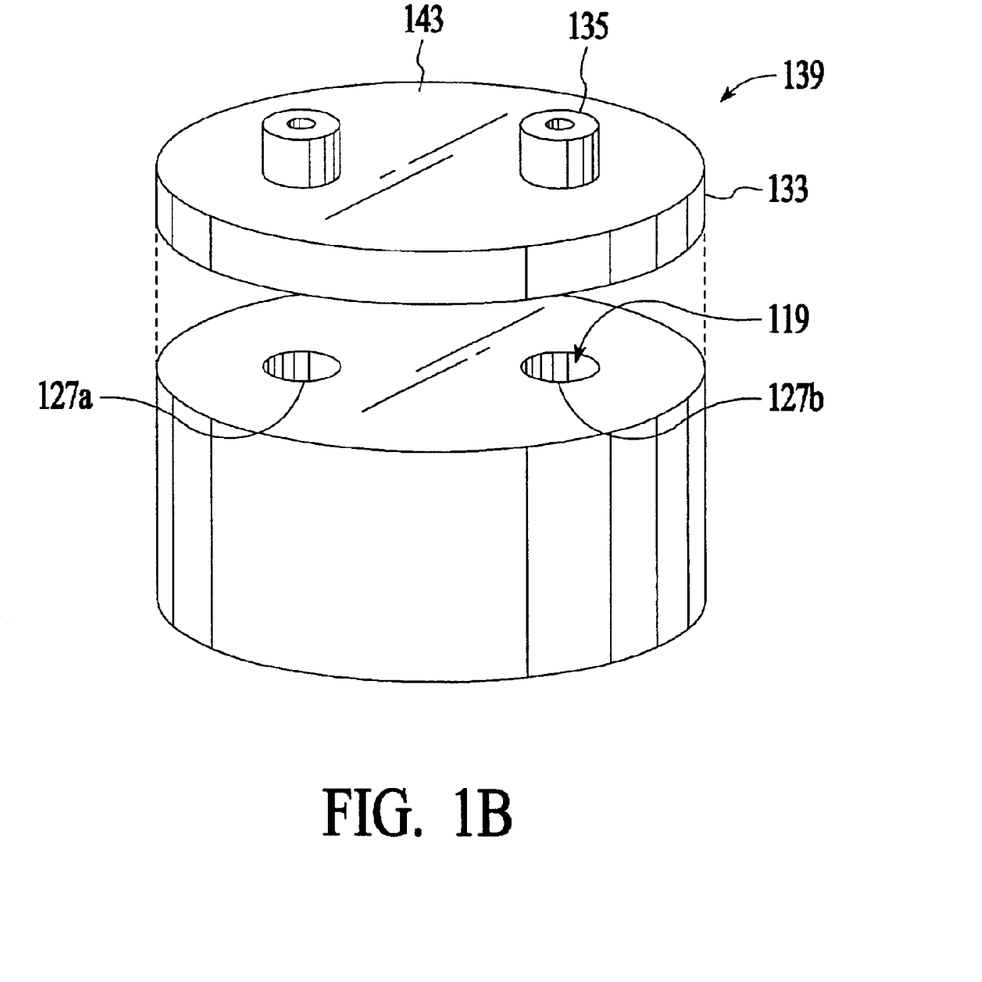

The barrier 139 may further comprise a ridge 135 about an outer perimeter of the conduits 119 which extends above the plane of the disk 133, as shown in FIGS. 1a and 1b, through which the supply tubes 131 are formed. For example, the barrier 139 may comprise a disk 133 with ridges 135 on the top (shown) or the bottom (not shown) of the disk 133 which are shaped like cylindrical sleeves about the supply tubes 131. In the version shown in FIGS. 1a and 1b, each ridge 135 fits into a recess 137 in the first section 113 of the pedestal 111 to provide a barrier to leakage of the fluid. The sealing surfaces 143 of each ridge 135 form a seal with surfaces in the recess 137 to inhibit leakage of the fluid flowing through the flowing through the ridges 135.

Figure 3C:
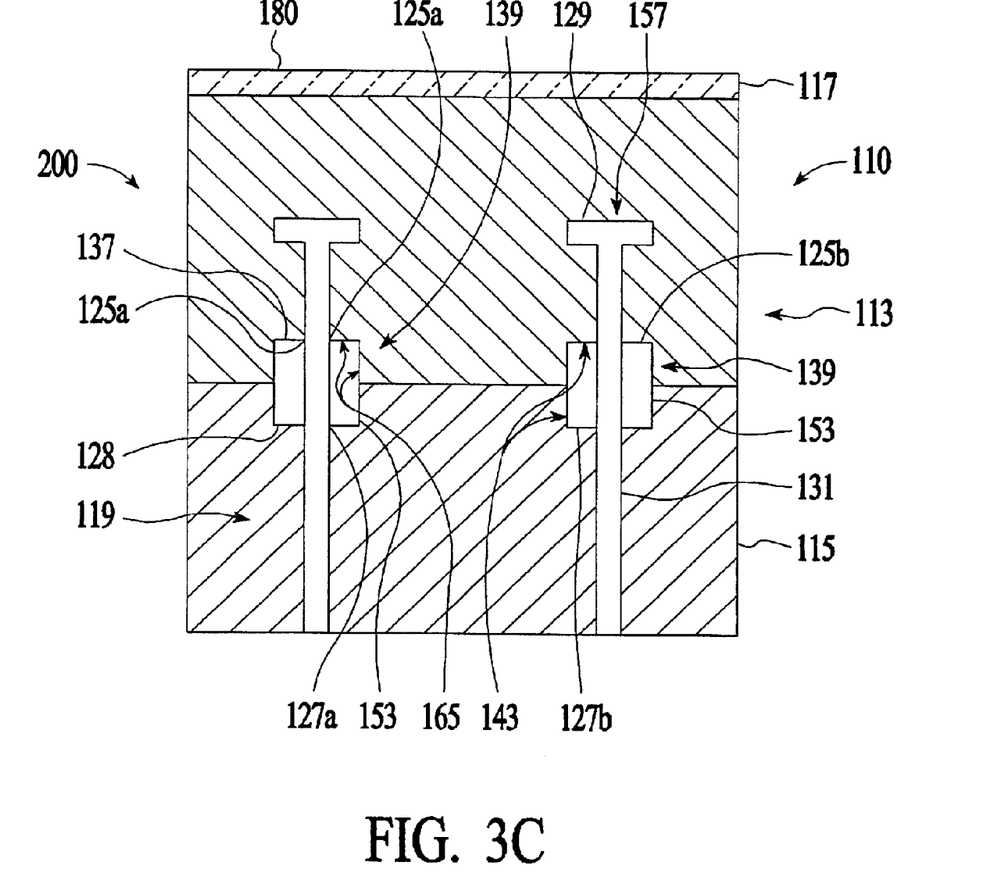
FIG. 3c is a schematic sectional side view of yet another version of a substrate support according to the present invention having a barrier.

In another version, the barrier 139 comprises one or more rings 153 about the supply tubes 131 which are arranged in recesses 137, 128 formed at the interface of the first and second sections 113, 115, as shown in FIG. 3c. Fluid flowing between an inlet or outlet 125a,b of the first section 113 and the inlet or outlet 127a,b of the second section 115 flows through the portion of the supply tube 131 formed in the ring 153, and is inhibited from leaking from the tube 131 by the surrounding ring 153. Each ring 153 fits into an upper recess 137 in the first section 113 and a lower recess 128 in the second section 115, and the sealing surfaces 143 of each ring 153 form a seal with surfaces 165 in the upper and lower recesses 137, 128 to inhibit leakage of the fluid flowing from one section into the other. The rings 153 inhibit leakage in the leak prone region about the inlets 125 and outlets 127 to the first and second sections 113, 115 of the pedestal 111, thereby maintaining a good flow of the fluid between the first and second sections 113, 115.

The barrier 139 also acts as a detector to detect leakage of the heat transfer fluid from the conduits 119. For example, the barrier 139 may comprise a fluid detection material that changes attributes upon exposure to the heat transfer fluid, thereby allowing for the detection of leakage of the fluid. The fluid detection material may be arranged about the conduits 119 in regions which are prone to leakage, such as for example about inlets or outlets to one or more sections 113, 115 of the pedestal 111, to detect leakage in these regions. In one version, the fluid detection material is located about a perimeter of the barrier 139. Detection of heat transfer fluid leakage by the barrier 139 may allow substrate processing to be halted soon after a leak occurs, thereby reducing the amount of damage done to the substrates 104 and chamber 106 by prolonged leakage of the fluid.

In one version, the barrier 139 comprises a fluid detection material that changes attributes upon exposure to the fluid, for example, by changing its optical properties. For example, the fluid detection material may change the reflectance, transmission or absorption of light incident upon the fluid detection material upon exposure to the fluid. The change in optical properties of the fluid detection material is a visually detectable signal which allows a chamber operator to directly monitor the barrier 139 to determine if a leak has occurred.

In one version, the fluid detection material is shaped as a porous film which changes optical properties by changing the reflectance of light incident on the fluid detection material upon exposure to the fluid. Before the porous film is exposed to the fluid, the porous film is substantially opaque, due to the irregular angles and phases at which the light is reflected about the pores of the porous film. Upon exposure to the fluid, the reflectance of the light incident upon the porous film becomes more regular, and thus the porous film becomes substantially clearer. This change in the reflectance or opacity of the porous ceramic material serves as a visual signal indicating that leakage has occurred. The fluid detection material may further comprise an indicator material, such as a material that is a different color, or a more vibrant color than the porous film, that is arranged such that it is at least partially obscured by the porous film. Upon exposure of the porous film to leaked fluid, the indicator material may become substantially visible through the porous film, thereby enhancing the visual fluid detection signal. A porous film suitable for detecting the leakage of the fluid may comprise, for example, an aerogel.

In another version, the fluid detection material comprises a material which changes optical properties by changing color upon exposure to the fluid. For example, the fluid detection material may comprise a material which undergoes a chemical reaction or physical reaction with the fluid to change the wavelengths and intensities of light absorbed by the fluid detection material, and thus the color of the fluid detection material. In one version, the fluid detection material comprises a fluid detection compound in a polymer which changes color upon exposure to the fluid. The change in color of the color changing material provides a visual signal indicating that leakage of the fluid has occurred.

In another version, the barrier 139 comprises a fluid detection material which changes attributes by changing its electrical resistivity upon exposure to the fluid, thereby allowing leakage of the fluid to be detected. Leakage of the fluid may be detected by monitoring a current passed through the fluid detection material. A change in the current, such as an increase or decrease in the current, indicates that the resistivity of the fluid detection material has changed and hence that the fluid detection material has been exposed to fluid leaking from the conduits 119. The resistivity-changing fluid detection material should be selected according to the heat transfer fluid used to control the temperature fluid. For example, the fluid detection material should have a sufficiently large change in resistivity upon exposure to the fluid that the change in resistivity can be used to generate an electrical signal. A suitable resistivity-changing fluid detection material, for a heat transfer fluid comprising may comprise, for example, one or more of silicon, viton, neoprene, the fluid detection material sold under the trademark "chemraz", and the fluid detection material sold under the trademark "kelraz". A chamber controller 300 may be adapted to pass the current through the barrier 139 and to monitor the current to determine if a leak has occurred. Once the controller 300 has determined that a leak has occurred, the controller 300 may provide an alarm in the form of, for example, an audible alarm, or an output to a computer screen, to inform the chamber operator that a leak has occurred. The chamber controller 300 may also comprise program code to halt substrate processing if a leak has occurred.

Thus, according to the present invention, a substrate support 110 comprises fluid conduits 119 to circulate a heat transfer fluid in the support 110 and a barrier 139 adapted to inhibit and detect leakage of the fluid from the fluid conduits 119. The barrier 139 comprises a fluid detection material that is adapted to change attributes upon exposure to the fluid, thereby providing a signal indicating that leakage of the fluid has occurred. The fluid detection material may comprise, for example, a material that changes in optical properties upon exposure to the fluid, such as a porous film, or a material which changes in electrical resistivity upon exposure to the fluid. The barrier 139 may reduce damage to substrates 104 and components in the chamber 106 from fluid leaking from the conduits 119 by providing a signal to alert a chamber operator or chamber controller 300 to the leaking fluid.

Although exemplary embodiments of the present invention are shown and described, those of ordinary skill in the art may devise other embodiments which incorporate the present invention, and which are also within the scope of the present invention. For example, other sealing fluid detection materials or fluid detection materials which change attribute upon exposure to the fluid may be used without deviating from the scope of the present invention. Also, the barrier 139 may be arranged around the conduits in ways other than those specifically mentioned, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A substrate support comprising:
   a pedestal comprising a substrate receiving surface to receive the substrate;
   a conduit in the pedestal to circulate a fluid to the pedestal; and
   a fluid leakage barrier comprising sealing surfaces that seal about the conduit to inhibit leaking of fluid from the conduit, the fluid leakage barrier comprising a fluid detection material having an electrical property that changes upon exposure to fluid leaking out from the conduit, wherein the change in the electrical property can be detected by passing a current through the fluid leakage barrier.

2. A support according the claim 1 wherein the electrical property of the fluid detection material is the electrical resistivity, and wherein the electrical resistivity of the fluid detection material changes upon exposure to the fluid.

3. A support according to claim 1 wherein the fluid leakage barrier comprises a disk having holes that allow fluid to pass therethrough, and wherein the fluid detection material is located about a perimeter of the disc.

4. A support according to claim 1 wherein the fluid leakage barrier comprises one or more rings about the conduits, the rings comprising the fluid detection material.

5. A substrate processing chamber comprising the substrate support of claim 1 and further comprising:
   a gas supply to provide a gas to the chamber;
   a gas energizer to energizer the gas;
   a gas exhaust to exhaust the gas; and
   a controller adapted to operate the gas supply, gas energizer and gas exhaust to process tho substrate.

6. A support according to claim 1 wherein the fluid leakage barrier is composed of the fluid detection material.

7. A substrate support for processing a substrate in an energized gas, the support comprising:
   a pedestal comprising a substrate receiving surface to receive the substrate;
   a conduit in the pedestal to circulate a fluid to the pedestal; and
   a fluid leakage barrier comprising sealing surfaces that seal about the conduit to inhibit leaking of fluid from the conduit, the fluid leakage barrier comprising a fluid detection material having an optical property that changes upon exposure to fluid leaking out from the conduit.

8. A support according to claim 7 wherein the fluid leakage barrier comprises a disk having holes that allow fluid to pass therethrough, and wherein the fluid detection material is located about a perimeter of the disc.

9. A support according to claim 7 wherein the fluid leakage barrier comprises one or more rings about the conduits, the rings comprising the fluid detection material.

10. A substrate processing chamber comprising the substrate support of claim 7 and further comprising:
- a gas supply to provide a gas to the chamber;
- a gas energizer to energize the gas;
- a gas exhaust to exhaust the gas; and
- a controller adapted to operate the gas supply, gas energizer and gas exhaust to process the substrate.

11. A support according to claim 7 wherein the optical property of the fluid detection material is the light reflectance, transmission, or absorption, and wherein the light reflectance, transmission or absorption of the fluid detection material changes upon exposure to the fluid.

12. A support according to claim 11 wherein the fluid detection material changes in color upon exposure to the fluid.

13. A support according to claim 7 wherein the fluid detection material is a porous film.

14. A support according to claim 7 wherein the fluid detection material is an aerogel.

15. A support according to claim 7 wherein the fluid detection material comprises a fluid detection compound in a polymer.

* * * * *